US012614585B2

(12) United States Patent
Morimoto et al.

(10) Patent No.: US 12,614,585 B2
(45) Date of Patent: Apr. 28, 2026

(54) APPARATUSES, SYSTEMS, AND METHODS FOR ODT PULSE WIDTH DURATION DETERMINATION

(71) Applicant: Micron Technology, Inc., Boise, ID (US)

(72) Inventors: Yukimi Morimoto, Sagamihara (JP); Atsuko Momma, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 18/774,514

(22) Filed: Jul. 16, 2024

(65) Prior Publication Data

US 2025/0182816 A1 Jun. 5, 2025

Related U.S. Application Data

(60) Provisional application No. 63/606,236, filed on Dec. 5, 2023.

(51) Int. Cl.
*G11C 11/4096* (2006.01)
*G11C 11/4076* (2006.01)
*H03K 19/00* (2006.01)
*H03M 13/09* (2006.01)

(52) U.S. Cl.
CPC ...... *G11C 11/4096* (2013.01); *G11C 11/4076* (2013.01); *H03K 19/0005* (2013.01); *H03M 13/09* (2013.01)

(58) Field of Classification Search
None
See application file for complete search history.

(56) References Cited

U.S. PATENT DOCUMENTS

| | | | | |
|---|---|---|---|---|
| 7,092,299 B2 * | 8/2006 | Kwak | .................... | G11C 5/063 |
| | | | | 365/198 |
| 2023/0076261 A1 * | 3/2023 | Sreeram | ............... | G11C 7/1006 |
| 2023/0142493 A1 * | 5/2023 | Kim | .................... | G11C 7/1084 |
| | | | | 365/189.18 |
| 2025/0037757 A1 * | 1/2025 | Oh | ........................... | G11C 5/04 |

* cited by examiner

*Primary Examiner* — Jany Richardson
(74) *Attorney, Agent, or Firm* — Dorsey & Whitney LLP

(57) ABSTRACT

A memory device includes an ODT control circuit which provides an ODT pulse signal responsive to a command. The ODT control circuit compresses an ODT off latency added with a CRC bit based on a value of an ODT on latency. The compressed value of the ODT off latency added with a CRC bit is combined with the ODT on latency to generate a compressed ODT offset value. The duration of the ODT pulse signal is based on the compressed ODT offset value, a burst length, and an ODT pulse width parity. The combination of the compressed ODT offset and burst length is done along circuits of an even path or circuits of an odd path based on when the command was received. However, the compression and the generation of the ODT offset is shared between the even and odd paths.

20 Claims, 5 Drawing Sheets

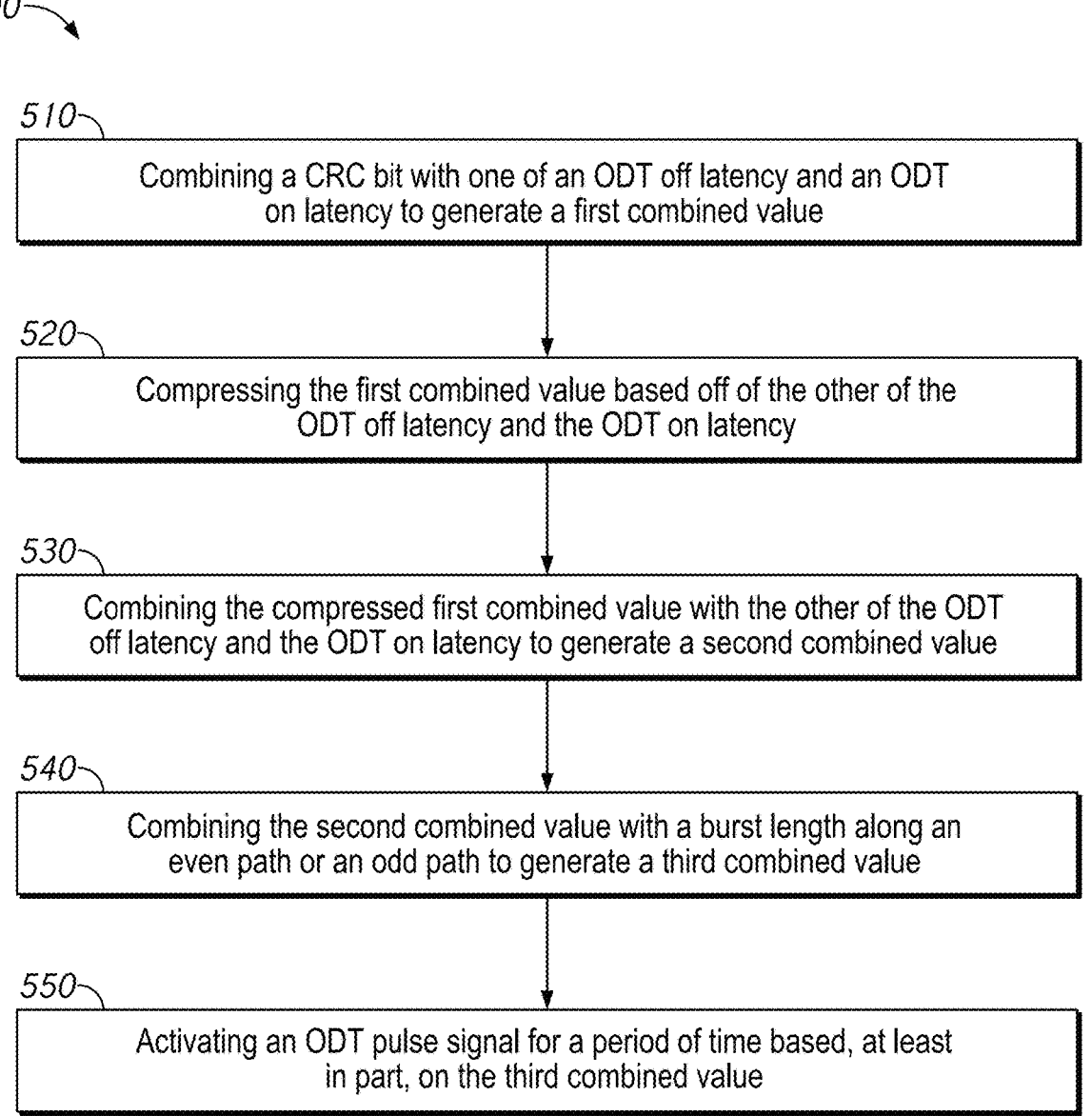

500

510
Combining a CRC bit with one of an ODT off latency and an ODT on latency to generate a first combined value 520
Compressing the first combined value based off of the other of the ODT off latency and the ODT on latency 530
Combining the compressed first combined value with the other of the ODT off latency and the ODT on latency to generate a second combined value 540
Combining the second combined value with a burst length along an even path or an odd path to generate a third combined value 550
Activating an ODT pulse signal for a period of time based, at least in part, on the third combined value

FIG. 5

APPARATUSES, SYSTEMS, AND METHODS FOR ODT PULSE WIDTH DURATION DETERMINATION

CROSS REFERENCE TO RELATED APPLICATION(S)

This application claims the benefit under 35 U.S.C. § 119 of the earlier filing date of U.S. Provisional Application Ser. No. 63/606,236 filed Dec. 5, 2023, the entire contents of which is hereby incorporated by reference in its entirety for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). During a read operation the physical signal (e.g., the charge) may be coupled to a conductive element to cause a change in voltage. That change in voltage may be amplified and read out to input/output terminals of the device. A write operation may reverse the process, receiving a signal at the terminals and providing a voltage to the memory cell (e.g., to charge the capacitor).

Since voltages may be rapidly applied to the terminals, it may be important to prevent stray voltages from being reflected at the terminals where the memory interfaces with outside devices. The memory may have multiple selectable termination legs which are used to match impedance during access operations. The impedance value of the data terminal RTT may be changed for a duration of time during access operations. The duration may be based on a number of different settings. It may be desirable to reduce the amount of logic gates (e.g., the amount of space and power) used to determine the duration based on the settings.

BRIEF DESCRIPTION OF THE DRAWINGS

FIG. 5 is a flow chart of a method according to some embodiments of the present disclosure.

DETAILED DESCRIPTION

Figure 1:
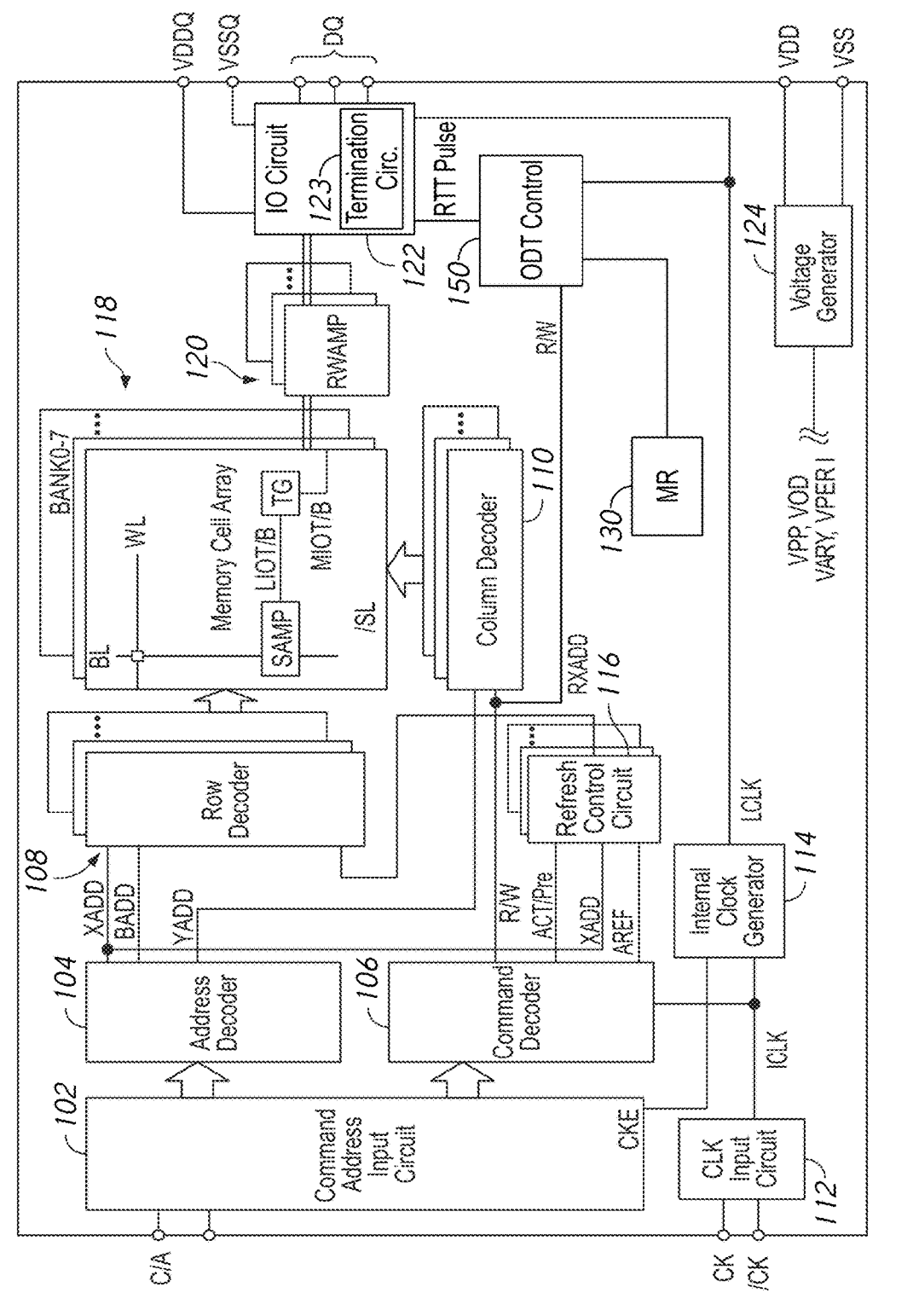
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a memory device is stored in a memory array. The information is conveyed as voltages along various internal signal lines. For example, a first voltage may represent a logical high, while a second voltage may represent a logical low. During access operations, such as read and write operations, the signals may be passed to and from the device between data terminals (DQ terminals) of the device and a data bus (DQ bus) which couples the device to a controller. The memory includes input/output (IO) circuits which couple the internal signals to the DQ terminals and DQ bus. The IO circuit includes a termination circuit, which includes one or more selectable resistive legs, each of which include a tunable resistor. The resistive legs may be coupled in parallel, and a number of the resistive legs which are active (e.g., a number of the tunable resistors coupled in parallel) may determine an overall impedance of the termination circuit. This in turn, ensures that the impedance along the line (e.g., the DQ bus) matches the impedance of the terminals (e.g., as set by the termination circuit) to help ensure that there aren't voltage reflections at the DQ terminal. This may be especially important in a memory module, where multiple memory devices may share the same DQ terminals.

During access operations the memory device may receive data along the DQ terminals. An on-die termination (ODT) control circuit changes a value of the termination resistor RTT for a duration of time. For example, the RTT value may be changed to a read value during a read operation or a write value during a write operation. The duration of time may be referred to as an ODT pulse width or an RTT pulse width. The RTT pulse width is determined by an RTT pulse width decoder or RTT control circuit. The memory device includes a settings register, such as a mode register which includes various settings related to the ODT pulse width. For example, the mode register may include settings such as an ODT off latency (or ODT off offset or ODT off timing value), an ODT on latency (or ODT on offset or ODT on timing value), a cyclic redundancy check bit (or CRC or error enable bit), and a burst length (or BL OTF enable). The burst length, when active, enables setting the data burst length of each command on the fly using the command address. The ODT on and off latencies specify a buffer amount of time the ODT resistance RTT should change before and after the data is received along the DQ terminal. The CRC determines if the burst length includes an extra error correction bit or not. The ODT control circuit receives the various inputs from the register and generates an ODT pulse width based on decoding the settings and the command address.

In a conventional memory device, the values of the ODT on and off latencies are first added together to generate an ODT offset value, and then that ODT offset value is fed into separate paths based on whether command is received on an even or odd divided clock. Along the even path the burst length (divided by two since the device is double data rate)

and CRC bit are added to the ODT offset which gives an ODT pulse width. At this stage the ODT pulse width may be grouped (e.g., rounded) into an even value, since divided clocks are used (whose one clock cycle represents two cycles of the system clock). If the ODT pulse width was odd, the remaining single bit (which is one clock cycle of the system clock) may be added at a later stage. Similarly, along the odd path the burst length and CRC bit are added to the ODT offset which gives the ODT pulse width, which is grouped into an even value. This order may be inefficient and lead to a relatively large number of logic gates used in the ODT control circuit to determine the ODT pulse width, as a large part of the decoding logic is duplicated on two branches (even and odd clock branches). Another way in which the conventional logic is inefficient is that the RTT pulse width is decoded to the LSB to determine its parity (even or odd), and then later it is rounded back to even numbers for shifting by the internal divided clocks. The logic gates used to determine the ODT pulse width may take up a relatively large amount of space and draw a relatively large amount of power. There may thus be a need to streamline how the ODT pulse width is determined.

The present disclosure is drawn to apparatuses, systems, and methods for ODT pulse width determination. In an ODT control circuit of the present disclosure, the burst length may be added as a final step of the process, in order to delay splitting the logic into even clock and odd clock paths until the final step of the process. Accordingly, all register settings, the CRC, ODT on latency, and ODT off latency, may all be decoded and combined to generate an ODT offset value (which includes the CRC information) before the split into the even and odd clock paths. For example, the ODT off latency and CRC are combined together to give a first combined value (referred to as off+CRC). The first combined value is combined with the ODT on latency to give a second combined value (referred to as ODT_offset+CRC). The second combined value is combined with burst length information to give a third combined value (referred to as RTT Pulse Width Comp), and the overall RTT pulse width is based on the third combined value.

An ODT control circuit may also (or instead) use a compression technique to reduce the number of possible outcomes early on and reduce overall logic gates required for decoding. In some embodiments, compression can be performed on the off latency combined with CRC (e.g., the first combined value). The compression may be used such that the second combined value (e.g., ODT_offset+CRC, or off+CRC combined with ODT on latency) has a specific parity, for example even. For example, the first combined value off+CRC may be compressed to have a matching parity with the parity of the ODT on latency, so that when combined (e.g., add or subtract), the second combined value will have an even parity.

The present disclosure is generally described in terms of first combining the ODT off latency and CRC to generate a first combined value of off+CRC. However, in other example embodiments, the ODT on latency and CRC may be first combined instead. For example, the first combined value may be on+CRC and then that value may be compressed based on the ODT off latency and the compressed value of on+CRC is combined with the ODT off latency.

In an example implementation of a RTT pulse width decoder circuit of the present disclosure, the ODT off latency is combined with the CRC setting (using circuits which are shared regardless of whether the command is received with the even or odd clock signal) to generate a first combined value. That first combined value, off+CRC, is then compressed to a value with an even parity or an odd parity based on a parity of the ODT on latency, and then the compressed first combined value is combined with the ODT on latency to generate a second combined value. The parity of the first combined value is controlled such that the parity of the second combined value will be even. For example, if the ODT on latency is even, then the first combined value may be rounded down to a nearest even value. If the ODT on latency is odd, then the first combined value may be rounded down to a nearest odd value. The second combined value is split into even clock and odd clock paths to be combined with the burst length setting in order to give a final compressed RTT pulse width. The burst length setting is always even and is determined by the combination of the burst length and the command address setting of each command. The final compressed RTT pulse width is always even. If the RTT pulse width is an odd value, the final RTT pulse width can be adjusted afterwards by adding a single bit to the compressed RTT pulse width. By combining the CRC information ahead of the even clock and odd clock split, and by using compression to reduce the number of signals to be decoded early on, an RTT pulse width decoder of the present disclosure may have many fewer logic gates compared to a convention RTT pulse width decoder circuit. This in turn may save space and power.

FIG. 1 is a block diagram of a semiconductor device according to an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. For example, memories may include 4, 16, 32 more or fewer banks. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or/BL.

The semiconductor device 100 may employ a plurality of external terminals that include command and address (C/A) terminals coupled to a command and address bus to receive commands and addresses, and a CS signal, clock terminals to receive clocks CK and/CK, data terminals DQ to provide data, and power supply terminals to receive power supply potentials VDD, VSS, VDDQ, and VSSQ. The external terminals may be coupled to a controller 140 which may operate the memory by providing various signals to the external terminals.

The clock terminals receive external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. For example, the internal clocks LCLK may be divided clock signals which are complementary clocks each of which has half the frequency of the system clocks CK and/CK. One of the divided clocks may be referred to as an even clock, because it has rising edges which correspond to even numbered rising edges of CK, while the other divided clock may be referred to as an odd clock, because it has rising edges which correspond to odd numbered rising edges of CK.

The C/A terminals receive commands and memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD.

The commands received through the C/A terminals are transferred, via the command/address input circuit 102 to a command decoder 106. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The command decoder 106 includes circuits to decode the internal command signals to generate various internal signals and commands for performing operations. For example, the command decoder 106 may provide a row command signal to select a word line and a column command signal to select a bit line. The command decoder 106 also provides activation and pre-charge signals to the different banks of the memory. An activation signal ACT may indicate that a word line in that bank should be activated, while a pre-charge signal Pre may indicate that the word lines should be pre-charged (e.g., closed) in anticipation of a next activation command. In some embodiments, the ACT and Pre signals may share a signal line.

The device 100 may receive commands and addresses as part of an access operation such as a read operation. As part of the access operation, a row address and bank address received along with an activate command. As part of the access operation, a column address and bank address are received along with a read command. Responsive to the read operation, read data is read from memory cells in the memory array 118 corresponding to the row address and column address. The commands associated with the read operation are received by the command decoder 106, which provides internal commands so that read data from the memory array 118 is provided to the read/write amplifiers 120. Responsive to the activate command ACT the row decoder 108 activates a word line associated with the row address. While the row is active, memory cells along that row are coupled to sense amplifiers activated by the column decoder 110 responsive to the read command to read data out along the LIOT/B lines. The read data is output to outside from the data terminals DQ via the input/output circuit 122. The command decoder 106 may then provide a pre-charge command Pre which may 'close' the active row.

The device 100 may receive commands and addresses as part of an access operation such as a write operation. As part of the write operation, a row address and bank address are received along with an activated command and a column address and bank address are received along with write data and a write command. Responsive to the write operation, write data supplied to the data terminals DQ is written to a memory cells in the memory array 118 corresponding to the row address and column address. The commands associated with the write operation are received by the command decoder 106, which provides internal commands so that the write data is received by data receivers in the input/output circuit 122. Responsive to the activate command the row decoder 108 activates a word line associated with the row address. While the row is active, memory cells along that row are coupled to sense amplifiers activated by the column decoder 110 responsive to the write command to receive write data. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. The command decoder 106 may then provide a pre-charge command which may 'close' the active row.

The device 100 may also perform refresh operations. The refresh operations may be performed as part of an auto-refresh operation, where a controller 140 issues an auto-refresh command or as part of a self-refresh operation, where the memory refreshes itself based on internal commands. The refresh control circuit 116 supplies a refresh row address RXADD to the row decoder 108, which may refresh one or more word lines WL indicated by the refresh row address RXADD. In some embodiments, the refresh address RXADD may represent a single word line. In some embodiments, the refresh address RXADD may represent multiple word lines, which may be refreshed sequentially or simultaneously by the row decoder 108. In some embodiments, the number of word lines represented by the refresh address RXADD may vary from one refresh address to another. The refresh control circuit 116 may be controlled to change details of the refreshing address RXADD (e.g., how the refresh address is calculated, the timing of the refresh addresses, the number of word lines represented by the address), or may operate based on internal logic.

The IO circuit 122 includes a termination circuit 123. The termination circuit 123 provides a calibrated impedance value to the DQ terminals, for example to match the impedance of the DQ terminals to the line impedance of the DQ bus between the DQ terminals and the controller 140. The termination circuit 123 includes a number of tunable resistors, which may be selectively coupled to the DQ terminals to provide a chosen impedance. The chosen impedance may be a setting based on properties of the controller and/or DQ bus. For example, the termination circuit 123 includes a number of selectable resistive legs, each with a tunable resistor of NQ. If X of the tunable legs are active, then the overall value may be (N/X) Ω. For example, if 240Ω resistors are used, then overall values such as 60Ω (four active legs), 40Ω (six active legs), and 30Ω (seven active legs) may be selected. Other values of the resistor and other numbers of legs may be used in other example embodiments.

Each of the tunable resistors may be adjustable in order to ensure that the impedance can be matched to a nominal value (for example, to ensure that each tunable resistor matches a value of 240Ω). The memory may have access to a reference resistor ZQ (not shown in FIG. 1) which has the nominal value. The reference resistor ZQ may be a resistor manufactured with extremely narrow tolerances (e.g., 5%, 1%, or 0.1% etc.) As part of the calibration operation, the resistance of each of the tunable resistors of the termination circuit 123 is adjusted to match the resistance of the reference resistor ZQ.

The memory device 100 may change the value of the termination resistance for different operations. For example, there may be a resting or park value for the resistance, a value for a write operation, and a value for a read operation. Other values may be also be specified for other operations. Responsive to a command, such as a read or write command, where the value of the termination resistance is changed, the ODT control circuit 150 may change the termination resistance in the termination circuit 123 to the specified value for a duration of time. The duration may be an ODT pulse width which is based on several settings of the mode register 130 as described in more detail herein.

The ODT control circuit 150 may decode the various settings from the mode register 130 into an ODT offset value, and then combine that with the burst length to generate an RTT pulse width, which determines how long to change the resistance of the termination circuit 123. Based on the decoded RTT pulse width, the ODT control circuit 150 generates an RTT pulse and keeps it active for a length of time based on the RTT pulse width. Responsive to the signal RTT pulse being active, the termination circuit 123 changes the resistance.

The command (e.g., read, write) may be received with timing based on the external clock CK or/CK, however the ODT control circuit 150 may use divided clocks such as LCLK. The ODT control circuit 150 may decode various register settings with circuitry which is shared in common whether the command was received with an even or odd divided clock, and then circuitry split into even and odd clock paths to decode command address for generating the compressed RTT pulse width. The RTT pulse width parity may be calculated separately and a single bit may be added to the compressed RTT pulse width as a final step. This order of decoding may save on space and power, since there are less duplicative circuits between the even and odd paths. This order of decoding also allows using compression to reduce the number of calculations which are used to generate the RTT pulse width, which may also reduce the power and space taken up by the ODT control circuit.

In some embodiments, there may be multiple ODT control circuits, each of which controls the ODT pulse width and resistance change for a type of operation. For example, there may be an ODT control circuit for write operations (Wr), an ODT control circuit for non-targeted write operation (WrNT) and an ODT control circuit for non-targeted read (RdNT) operations. The non-targeted write and read operations WrNT and RdNT may indicate that the controller is performing a write or read operation on a different memory device than the memory device 100. For example, the memory device 100 may be part of a memory module which packages together several memory devices, and the non-target operations may indicate that the controller is accessing a different memory of the module. Other numbers of ODT control circuits and other operations which are associated with ODT control circuits may be used in other example embodiments.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
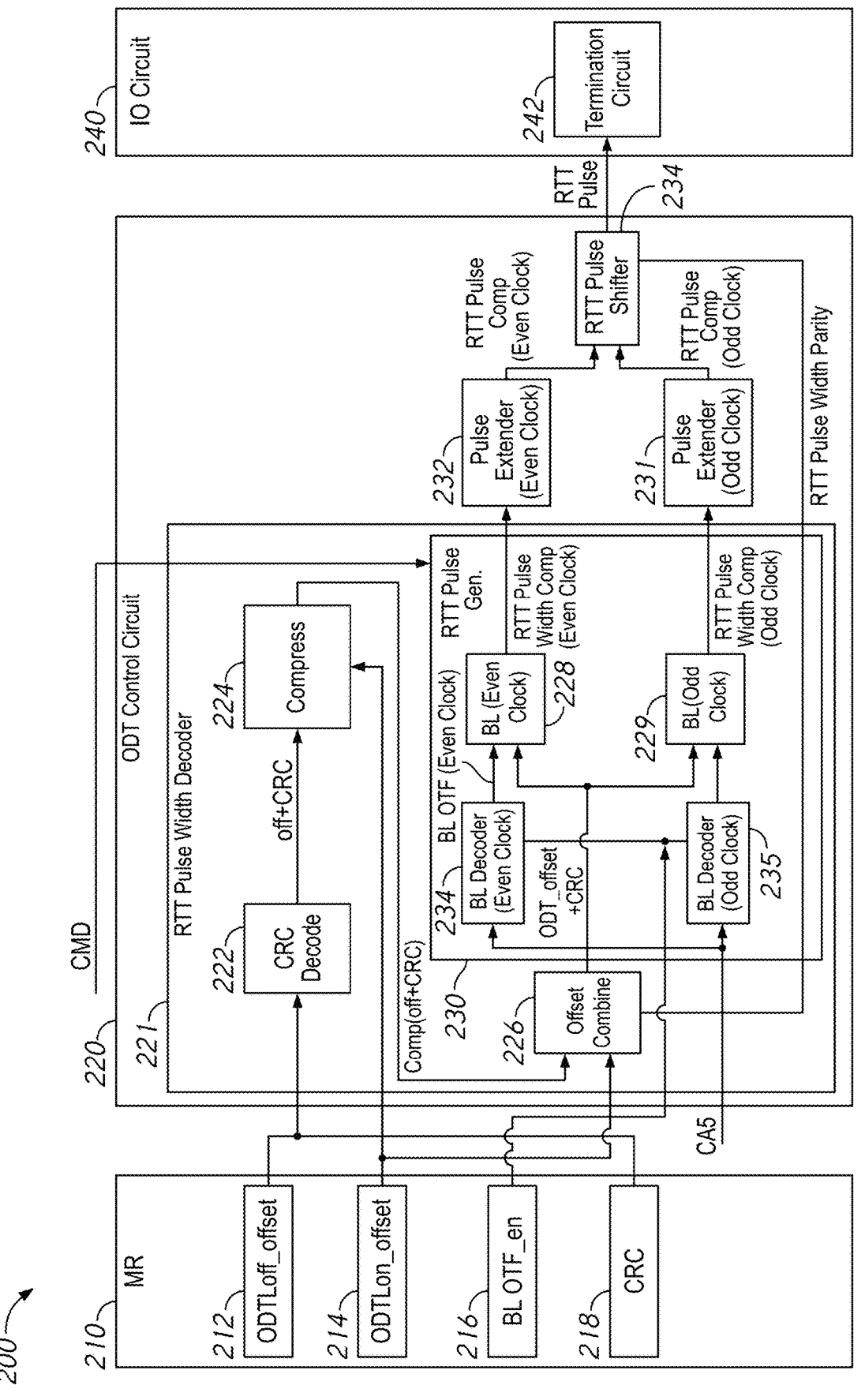
FIG. 2 is a block diagram of ODT control in a memory device according to some embodiments of the present disclosure.

FIG. 2 is a block diagram of ODT control in a memory device according to some embodiments of the present disclosure. FIG. 2 shows a memory device 200 which may, in some embodiments, implement a portion of the memory device 100 of FIG. 1. In particular, FIG. 2 shows components and signals relevant to explaining how the ODT pulse width is determined. Certain components and signals have been omitted from the view of FIG. 2.

The memory device 200 includes a mode register 210 (e.g., 130 of FIG. 1), an ODT control circuit 220, and an IO circuit 240. The mode register 210 stores various settings 212-218 related to the ODT pulse width. The ODT control circuit 220 generates an ODT pulse RTT Pulse responsive to an access command CMD (e.g., R or W of FIG. 1). The ODT control circuit 220 (e.g., 150 of FIG. 1) includes RTT Pulse Width Decoder 221 which determines an ODT pulse width (ODT Pulse Width Comp) based on those mode register settings and, in some embodiments, the command address. The ODT control circuit 220 also includes pulse extender circuits 231 and 232, and an RTT pulse shifter circuit 237 which generate an ODT pulse RTT Pulse which has a width based, in part, on the ODT pulse width decoded by the ODT pulse width decoder circuit 221. The IO circuit 240 (e.g., 122 of FIG. 1) with a termination circuit 242 (e.g., 123 of FIG. 1) which changes a value of a termination resistor responsive to the ODT pulse signal RTT Pulse.

FIG. 2 may show the components associated with a single type of command CMD. For example, the ODT control circuit 220 and settings in the mode register 212-218 may be associated with a single type of command CMD such as a write command. Those components and settings may, in some embodiments, be repeated for other types of commands. For example, a WrNT command may have its own ODT control circuit 220, and its own values of ODTLoff_offset, ODTLon_offset etc.

The mode register 210 is a collection of storage elements which store information and/or settings about the memory device 200. The mode register the mode register 210 may be a collection of storage elements, such as latch circuits, which are organized into registers, each of which store one or more values as a binary number. In some embodiments, the mode register 210 may include, or may be loaded with information from, non-volatile storage elements, such as fuses. Those values in the mode register 210 may be accessed by internal circuits of the memory device 200. For example, certain values may be provided to other circuits of the memory device 200 to control their operation. Certain values may also be set by operations within the memory device (e.g., to set the value of flags, to change values which report the results of sensors, etc.). The values in the mode register 210 may also be externally accessible. For example, a controller may perform mode register read operations to read the value(s) from a specified register or mode register write operations to change the value(s) of a specified register. Some registers may be read-only registers which cannot be the target of a mode register write operation.

The mode register 210 includes various settings relevant to determining a length of the ODT pulse width. In particular, four settings are shown, the ODT off latency ODTLoff_offset 212, the ODT on latency ODTLon_offset 214, the burst length BL OTF_en 216, and a cyclic redundancy check (CRC) or error enable signal CRC 218. The ODT on and off latency 212 and 214 as well as the CRC setting 218 may be settings of the memory which generally remain constant between different access operations. The burst length may vary between access operations. The mode register stores the burst length setting BL OTF_en. If the setting 216 is inactive, then the burst length BL will have a constant value from access operation to access operation (e.g., a length of 16). If the setting 216 is active, then a signal along the command/address bus may indicate the BL. In an example implementation, the pin CA5 may have a first state for a first BL (e.g., 16 bits) and a second state for a second BL (e.g., 8 bits). While CA5 is shown in FIG. 2, other bits of the command/address bus and/or other signals may be used to set the burst length in other example embodiments.

The ODT control circuit 220 includes an RTT pulse width decoder 221. The RTT pulse width decoder circuit 221 decodes various settings, such as the settings 212-218 to generate an RTT pulse width, RTT Pulse Width Comp, which may be in synchronization with an even or odd divided clock. The RTT pulse width decoder 221 includes burst length decoder circuits 234 and 235 which generate a burst length (or on-the fly burst length) BL OTF based on the BL OTF_en setting 216 and the command. There may be a first and a second BL decoder circuit 234 and 235 and respective first and second BL OTF signals for even and odd clock paths. The burst length decoder circuits 234 and 235 may provide the burst length BL OTF at a first value if the enable signal 216 is inactive, and provide the burst length BL OTF with a first or a second value based on CA5 if the enable signal 216 is active. The burst length BL OTF specifies a number of bits of information which are received along each data terminal as part of an access operation. For example, the burst length may be 8, 16, 32, or 64 in some embodiments. Other lengths may be used in other examples. The burst length specifies a number of bits, which are received on both rising and falling edges (e.g., twice per cycle) of the system clock. So if the burst length is 16, then bits are received during 8 system clock cycles (16 rising and falling edges) or 4 divided clock cycles (e.g., half the frequency of the system clock). Accordingly, when working with divided clocks, only even width changes are possible unless sacrificing timing margins. As described in more detail herein, the RTT pulse shifter circuit 237 may be used to adjust the pulse width for odd widths.

The ODT off and on latencies ODTLoff_offset 212 and ODTLon_offset 214 specify a length of time (in system clock cycles) that the ODT pulse width should be extended (on either side of information being sent/received along the DQ terminal) as a buffer. For example, the ODT on offset ODTLon_offset 214 specifies a length of time that the RTT value should be changed before information begins being received, while the ODT off offset ODTLoff_offset 212 specifies a length of time that the RTT value should remain changed after information stops being received. The CRC enable signal 218 indicates if the current operation includes a cyclic redundancy bit. If the CRC enable signal 218 is active, then the access operation includes an extra bit used for CRC operations by the controller. If the CRC enable signal 218 is inactive, then no extra CRC bit is used.

The RTT pulse width decoder 221 determines a compressed ODT pulse width RTT Pulse Width Comp and an RTT pulse width parity based on the settings 212-218 and a command address CA5. The ODT pulse width is sum of the compressed ODT pulse width and the RTT pulse width parity and represents a duration of time that the signal RTT Pulse is active during an access operation. The ODT control circuit will generate the ODT signal RTT Pulse such that it is active for a duration of time (in clock cycles) based on the RTT pulse width. The RTT pulse width decoder circuit 221 combines the values of the ODT on and off latencies with the CRC enable signal to determine a value of an ODT offset ODT_offset+CRC using circuits shared between even and odd divided clocks. The ODT offset and CRC represents the amount of time which is added to the burst length (divided by two) to generate the ODT pulse width. The ODT control circuit 220 determines the combined ODT offset and CRC value before splitting into even and odd paths (e.g., at the RTT pulse generator circuit 230).

The ODT control circuit 220 includes a CRC decoder circuit 222 which adjusts the length of ODTLoff_offset 212 based on whether or not the CRC enable signal 218 is active or not and provides a signal off+CRC based on that adjustment. For example, the value of ODTLoff_offset could be one of a range of values, for example either +4, +3, +2, +1, 0, −1, or −2, expressed as <+4:−2>. If the CRC enable signal is inactive, then the range of possible values remains <+4:−2>. If the CRC enable signal is active, and there is an extra CRC bit, then the range of possible values changes to <+5:−1> to account for an extra bit being added. The CRC decoder circuit 222 provides a value off+CRC which reflects the value of the ODT off latency combined with CRC.

The ODT control circuit 220 includes a compression circuit or compress circuit 224, which compresses the value off+CRC based on the values of off+CRC and the ODT on offset into a compressed value comp (off+CRC). The value of the overall compressed value comp (off+CRC) is controlled so that when combined with the ODT on latency to form ODT_offset+CRC, the value of ODT_offset+CRC will be even. Given that, the compression circuit 224 compresses the value of off+CRC into a parity 0 or parity 1 value (e.g., even or odd), potentially by rounding the value, based on the parity of the value of the ODT on latency (e.g., whether ODT on latency is an even or odd value). For example, if the ODT on latency has an even value, then in order for the combination of off+CRC and the ODT on latency to be an even result, then the value of comp (off+CRC) which is combined with the ODT on latency must also be even. If the ODT on latency has an odd value, then in order for the combination of off+CRC and ODT on to be even, the value of comp (off+CRC) must also be odd.

Accordingly, the compression circuit 224 may round the value of off+CRC down to the nearest even value when the ODT on latency is even. Similarly, the Compress circuit 224 may round the value of off+CRC down to the nearest odd value when the ODT on latency is odd. For example, if off+CRC is +3, and the ODT on latency is odd, then the effective value, or compression of off+CRC would remain +3, since +3 is also an odd value. However, if the value of the ODT on latency was even, compression of off+CRC would become +2, since that is rounding down to the closest even value. In some embodiments, only the least significant bit of the ODT on latency may be used to determine how to compress off+CRC, since the LSB will determine the parity of the value (e.g., if the value is even or odd).

The compressed off+CRC value comp (off+CRC) is provided to an offset combination circuit 226, which determines a value of ODT_offset+CRC based on the combination of the compressed value of off+CRC and the ODT on offset. The offset combination circuit 226 may generally generate ODT_offset+CRC as difference between the compressed value of off+CRC and ODTLon_offset. However, certain combinations may be forbidden. An example of the calculation of the ODT_offset+CRC value based on the compression of off+CRC and ODTLon_offset is shown in more detail in FIG. 3.

The offset combination circuit 226 provides the value to even clock and odd clock paths 228 and 229 respectively of an RTT pulse generator circuit 230. The even and odd clock paths combine the ODT_offset+CRC signal with the burst length information from the burst length decoders 234 and 235 to generate a compressed ODT pulse width RTT Pulse Width Comp. The even clock path circuits 228 generate the signal RTT Pulse Width Comp in synchronization with an even divided clock, and the odd clock path circuits 229 generate the signal RTT Pulse Width Comp in synchronization with an odd divided clock.

The pulse extender circuits 231 and 232 respectively extend the compressed RTT pulse width to generate compressed RTT pulses RTT Pulse Comp. Similar to the even and odd clock circuits 228 and 229, the pulse extender circuits 231 and 232 are split between even and odd clock paths. The RTT Pulse Shifter circuit 237 adds the remaining RTT pulse width parity, if any, to the RTT pulse comp signal to generate a width of the RTT pulse, then shifts the start of the RTT pulse according to settings to determine when the RTT pulse signal should become active. The RTT pulse shifter circuit 237 provides the RTT Pulse signal at an active level for a duration of time based on the compressed RTT pulse width RTT Pulse Comp (and the RTT Pulse Width Parity, which determines if any additional adjustment is needed). The RTT pulse signal is passed to the termination circuit 242 of the IO circuit 240. While the signal RTT Pulse is active, the termination circuit 242 changes a value of the termination resistor. What value the termination resistor is changed to is based on the type of the command CMD and settings.

The even clock and odd clock paths 228 and 229 refer to whether the command CMD was received on a rising edge of an even divided clock or on a rising edge of an odd divided clock, and not to whether any of the values such as ODTLon_offset or off+CRC are even or odd values. The even clock and odd clock paths 228 and 229 along with a pulse width extenders circuit 231 and 232 combine ODT_offset+CRC with the number of clock cycles over which information will be received as part of the access operation. For example, the RTT pulse generator circuit 230 may combine the burst length BL OTF with the ODT_offset+CRC. The combination, and whether the CMD was received on an even or odd clock may determine when the RTT pulse becomes active. For example along the even path 228 the pulse RTT pulse will become active in synchronization with the even divided clock. Along the odd path 229, the pulse RTT pulse will become active in synchronization with the odd divided clock. The pulse width extender circuit 232 of the RTT pulse generator circuit 230 will activate the pulse RTT pulse for a duration based on the combination of ODT_offset, CRC, and the BL/2. The RTT pulse provided by the RTT pulse generator circuit 230 is generated with timing based on one of the divided clock signals (e.g., either the even divided clock if the even path 228 was used or the odd divided clock if the odd path 229 was used). Accordingly, the RTT pulse may be active for an even number of system clock cycles, since each cycle of the divided clocks represents two cycles of the system clock.

An RTT pulse shifter circuit 237 receives the compressed RTT pulse from either the pulse extender 232 or the pulse extender 231. The RTT pulse shifter circuit 237 adds the RTT pulse width parity (which determines if the overall RTT pulse width is an even or odd number of clock cycles) to the compressed RTT Pulse RTT Pulse Comp and provides the ODT signal RTT Pulse to the termination circuit 242. The RTT pulse width parity is provided by the offset combination circuit 226. For example, if the RTT pulse width parity is 1, the RTT pulse shifter circuit 237 may add a single system clock cycle to the duration of the RTT Pulse signal if the RTT pulse width parity indicates that the RTT Pulse signal should have an odd value. For example, whether the RTT Pulse signal should have an odd value or not can be determined by looking at a LSB of ODTLon_offset, an LSB of ODTLoff_offset, and CRC (which may require only a relatively few logic gates). If the total number of odd values is odd, the RTT Pulse width is an odd value so RTT Pulse Width Parity is active. If the total number of odd values is even, the RTT Pulse signal width is an even value so RTT Pulse Width Parity is inactive. The RTT pulse shifter circuit 237 may also determine when to activate the signal RTT Pulse signal such that the RTT pulse will be activated a number of (system) clock cycles ahead of information along the DQ terminal based on ODTLon_offset.

In this manner, the RTT pulse generator circuit 230 includes components which are split into even clock and odd clock paths (e.g., 228 and 232 and 229 and 231) based on whether the command was received in synchronization with the even or odd divided clocks. The other circuits of ODT control circuit 220 may be shared regardless of whether the command was received in synchronization with the even or odd divided clock. In other words, regardless of whether the circuits of the even clock path 228 or the circuits of the odd clock path 229 are used, the other circuits of the RTT pulse width decoder 221 such as the CRC decoder circuit 222, the compression circuit 224, and the offset combination circuit 226 are all used in common.

In an example implementation, the CRC decoder circuit 222 may be implemented with 14 two-input NAND gates, the compress circuit 224 may be implemented with 8 two-input NAND gates, the offset combinations circuit 226 may be implemented with 25 two-input NAND gates, and each of the even clock and odd clock paths 228 and 229 may be implemented with 10 two-input NAND gates. Accordingly, the overall combination of these components of the ODT control circuit 220 may be 67 two-input NAND gates. In comparison, an example implementation of a conventional ODT control circuit may include over a hundred logic gates, in a mix of two and three input NAND gates. Accordingly, the ODT control circuit 220 may have greatly reduced size (e.g., roughly half the size) of a conventional ODT control circuit.

While the ODT control circuit 220 is described with respect to first combining the ODT off latency and CRC, and then compressing that value based on ODT on, in other example embodiments, the order may be swapped. For example, ODT off and ODT on may effectively change places, and ODT on may be combined with CRC and then that value compressed based off of ODT off.

Figure 3:
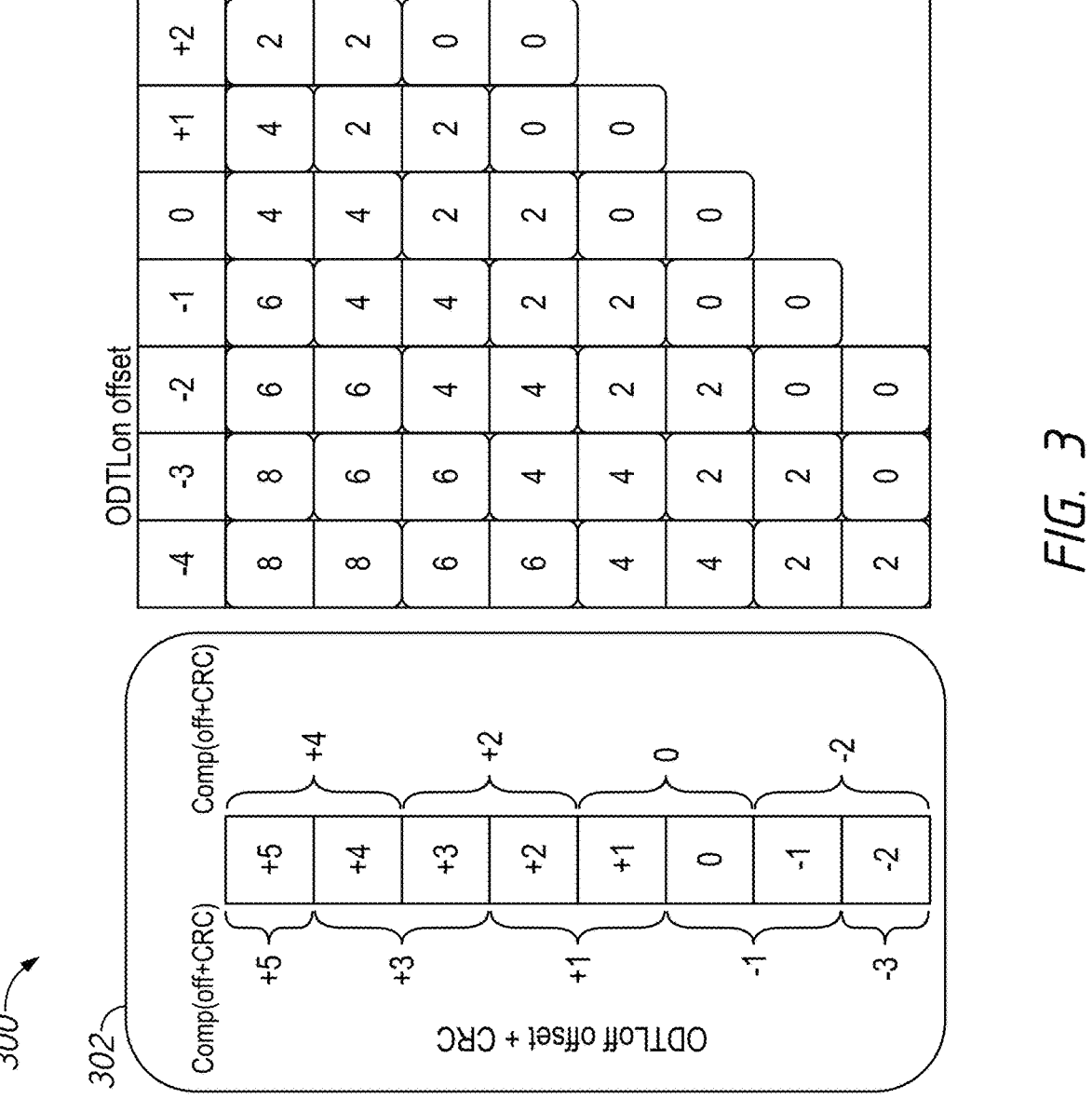
FIG. 3 is a table showing an example of ODT offset determination according to some embodiments of the present disclosure.

FIG. 3 is a table showing an example of ODT offset determination according to some embodiments of the present disclosure. The table 300 may, in some embodiments, represent an example of a specific implementation where ODT_offset+CRC is determined. The table 300 may represent operations of an ODT control circuit 150 of FIGS. 1 and/or 220 of FIG. 2, such as the operation of a compress circuit (e.g., 224 of FIG. 2) and offset combination circuit (e.g., 226 of FIG. 2). For the sake of example, FIG. 3 is described with respect to certain possible values and certain ranges of values for the various settings. However, these are for example only. Other values, other ranges of values, other possible numbers of values and so forth are possible in other example embodiments.

The table 300 shows a horizontal axis which is indexed by the possible values of ODTLon_offset (e.g., 214 of FIG. 2). In this example, ODTLon_offset may have values of −4, −3, −2, −1, 0, +1, and +2. In this case, negative values represent times extending before a beginning of the burst length, while positive values represent times extending after the beginning of the burst length. The vertical axis of the table 300 is indexed by the possible values of ODTLoff_offset (e.g., 212 of FIG. 2) combined with the CRC enable value (e.g., 218 of FIG. 2). For example the vertical axis may be indexed by off+CRC of FIG. 2. The values of off+CRC are shown in the vertical column of boxes. The possible values of off+CRC in this example of +5, +4, +3, +2, +1, 0, −1, −2, and −3, where positive values indicate time after an end of the burst length and negative values represent time before the end of the burst length. The entries of the table 300 represent output values for the ODT offset ODT_offset+CRC, which represent the combination of ODTLon_offset with off+CRC.

The value of ODTLon_offset is used to compress the values of off+CRC into a compressed value comp (off+CRC), by determining if a given value of off+CRC should be rounded down or not. The box 302 shows a vertical column of values of off+CRC and then a column on the left and right side of compressed values comp (off+CRC). The left column shows how the values of off+CRC may be compressed into comp (off+CRC) if ODTLon_offset has an odd parity, and the right column shows how the values of off+CRC may be compressed into comp (off+CRC if ODTL_on_offset has an even parity. If the value of ODTLon_offset is even, then the value of off+CRC is rounded down to the next even number. If the value of ODTLon_offset is odd, then the value of off+CRC is rounded down to the next odd number. For example, if ODTLon_offset has parity 0 (even), the values of off+CRC should be rounded down to parity 0, so off+CRC +3 and +2 are both rounded to +2 (parity 0). If ODTLon_offset has parity 1 (odd), the values of off+CRC should be rounded down to parity 0, so off+CRC +3 and +2 are rounded to different values of parity 1 (+3 and +1 respectively).

The way to compress off+CRC may be determined by the parity of off+CRC and the parity of ODTLon_offset. When the parity of the compressed off+CRC and the parity of ODTLon_offset are the same (e.g. parity 1 and parity 1), the compressed off+CRC-ODTLon_offset gives parity 0 (even) which can be achieved using divided clocks. Therefore, if the parity of off+CRC and ODTLon_offset does not match, off+CRC is rounded down so that the parity of off+CRC matches the parity of ODTLon_offset. For example, if ODTLon_offset is −2 (parity 0), and off+CRC is +3 (parity 1), off+CRC is compressed to +2 (parity 0) to match the parity of ODTLon_offset. If ODTLon_offset is −2 (parity 0) and off+CRC is +2 (also parity 0), the compressed off+CRC remains +2 as the parity matches that of ODTLon_offset. Certain combinations on the table are forbidden and shown without values on the table. For example, the forbidden values may be the combinations which would result in a negative value of ODT_offset+CRC.

Figure 4:
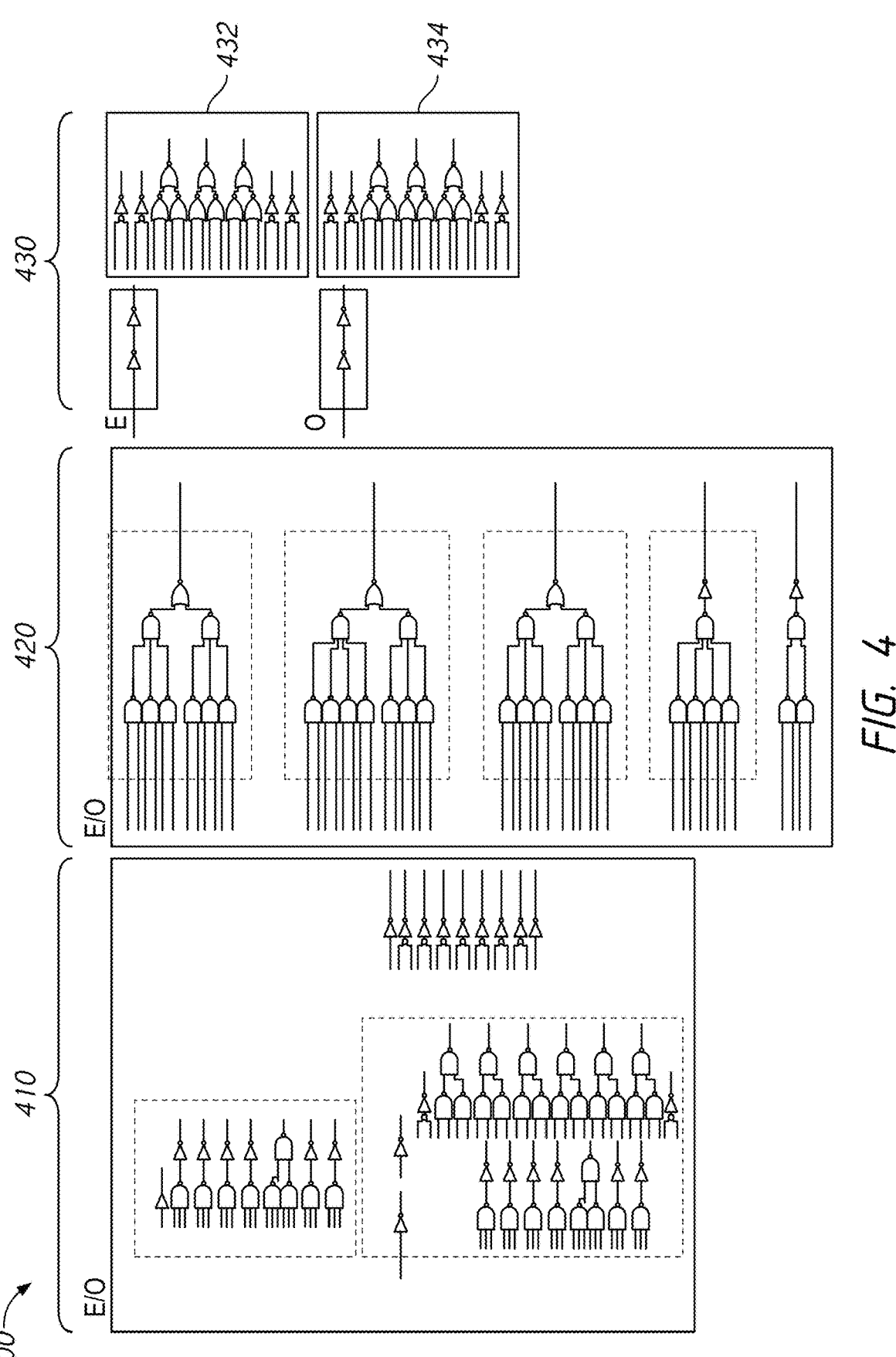
FIG. 4 is a schematic diagram of an example layout of an ODT control circuit according to some embodiments of the present disclosure.

FIG. 4 is a schematic diagram of an example layout of an ODT control circuit according to some embodiments of the present disclosure. The ODT control circuit 400 may, in some embodiments, represent an example implementation of an ODT control circuit such as the ODT control circuit 150 of FIG. 1, and/or 220 of FIG. 2. FIG. 4 shows an example layout and examples of logic gates may be distributed between different elements of the ODT control circuit 400. Since the focus of FIG. 4 is on the overall layout, rather than on the details of the implementation, certain details such as signals, connections between different elements, and so forth are not shown in FIG. 4.

The ODT control circuit 400 is shown as grouped into three circuit areas 410, 420, and 430. Each circuit area includes the logic gates which perform various functions. Different organizations of the functional elements of the ODT control circuit 400 into circuit areas may be used in other example embodiments. The first and second circuit areas 410 and 420 are shared between even and odd paths. In other words, the logic gates of the first and the second areas 410 and 420 are used whether or not the command is received in sync with the even divided clock or the odd divided clock. The shared areas are marked with 'E/O'. The third circuit area 430 is split between an even path (marked E) 432 and an odd path 434 (marked O). The logic circuits of the even path 432 are used when the command is received in sync with an even divided clock, while the logic circuits of the odd path 434 are used when the command is received in sync with an odd divided clock. In some embodiments, when the even path 432 is used, the odd path 434 is not used, and vice versa.

The ODT control circuit 400 includes a first circuit area 410. The first circuit area 410 includes logic gates which perform functions such as decoding the ODT off and on latencies from binary to decimal values as well as functions such as the CRC decoder (e.g., 222 of FIG. 2) and compress circuit (e.g., 224 of FIG. 2). The first circuit area 410 combines the ODT off latency with CRC to generate off+CRC, and then compresses the value of off+CRC based on the ODT on latency.

The second circuit area 420 uses the values of off+CRC (generated by the first circuit area 410) and the ODT on latency to generate an ODT_offset+CRC value. For example, the second circuit area 420 includes logic gates which implement the offset combination circuit 226 of FIG.

2. The third circuit area 430 determines the overall compressed RTT pulse width based on the ODT_offset+CRC value (provided by the second circuit are 420) and the burst length (divided by two). The third circuit area 430 is split into separate even and odd paths 422 and 424 respectively. The even path 422 (e.g., 228 of FIG. 2) combines the ODT offset with the burst length when the command was received in sync with an even divided clock, while the odd path 424 (e.g., 229 of FIG. 2) combines the ODT offset with the burst length when the command was received in sync with an odd divided clock.

As may be seen from the example layout of FIG. 4, since the circuits are only split as a final step, only the components of the third circuit area 430 are repeated for both even and odd paths. Since each of the even clock and odd clock paths 432 and 434 use relatively few components, doubling the components of only the third circuit area 430 saves a great deal of space compared to if the second circuit area 420 (and/or the first circuit area 410) were also doubled. Similarly, the use of compression may also reduce the number of signals and the amount of logic gates which are used in the second circuit area 420. In some example embodiments, the ODT control circuit 400 may take up less than half of the space of a conventional ODT control circuit. Since the ODT control circuit 400 may be repeated for several different types of command, this may lead to a very large overall space saving.

FIG. 5 is a flow chart of a method according to some embodiments of the present disclosure. The method 500 may, in some embodiments, be implemented by one or more of the apparatuses or systems described herein. For example, the method 500 may be performed by an ODT control circuit such as 130 of FIG. 1, 220 of FIG. 2, and/or 400 of FIG. 4.

The method 500 may begin with block 510, which describes combining a CRC bit with one of an ODT off latency and an ODT on latency to generate a first combined value. For example block 510 may include adding an ODT off latency (e.g., ODTLoff_offset) and a state of a cyclic redundancy check bit (e.g., CRC) to generate off+CRC as the first combined value. For example, the block 510 may include adding one to the value of the ODT off latency value if the cyclic redundancy check bit is active, or maintaining the value of the ODT off latency if the cyclic redundancy check bit is inactive. The steps of block 510 may be performed by a CRC decode circuit (e.g., 222 of FIG. 2) which may be part of the first circuit area 410 of FIG. 4.

Block 510 is followed by block 520, which describes compressing the first combined value based off of the other of the ODT off latency and the ODT on latency. For example, if the first combined value is the sum of the ODT off latency and the CRC bit, then that value may be compressed based on an ODT on latency (e.g., ODTLon_offset) to give a compressed value (e.g., comp (off+CRC)). If the first combined value is the sum of the ODT on latency and the CRC bit, then that value may be compressed based on the ODT off latency. The steps of block 520 may be performed by a compress circuit (e.g., 224 of FIG. 2) which may be part of a first circuit area 410 of FIG. 4.

Block 520 may be followed by block 530, which describes combining the compressed first combined value with the other of the ODT off latency and ODT on latency to generate a second combined value (e.g., ODT_offset+CRC). The first combined value may be compressed such that the second combined value always has an even parity. In an example implementation, the first combined value (off+CRC) is compressed in a way that the parity of the ODT on latency and the parity of the first combined value match.

As part of the compression of the first combined value, the block 520 may include retaining the value of the first combined value if the parities match or rounding down the value to the nearest value with the opposite parity if the parities do not match. For example, if the value of the sum of the ODT off latency and the CRC is +2, and the ODT on latency is −2, then the compressed value of the sum would be +2, but if the ODT on latency was −1, then the compressed value of the sum would be +1. Block 530 may include adding or subtracting the compressed first combined value with the other of ODT off and on (e.g., whichever wasn't combined as part of the first combined value). For example, the method 500 may include subtracting the ODT on latency from the compressed sum of the ODT off latency and the CRC (e.g., ODT_offset+CRC=comp (off+CRC)−ODTLon_offset). Since the compressed first combined value and the other of the ODT on latency and ODT off latency have matching parities (e.g., either both are even or both are odd), then the resulting compressed sum of the ODT latencies and CRC may always be even. The step of block 530 may be performed by an offset combination circuit, such as 226 of FIG. 2, which may be included in the second circuit area 420 of FIG. 4.

Block 530 is followed by block 540, which describes combining the second combined value with a burst length along an even clock path or an odd clock path to generate a third combined value (e.g., RTT Pulse Comp). For example, block 540 may include generating the compressed RTT pulse width (e.g., the third combined value) by combining the compressed sum of ODT off latency and the CRC with an ODT off latency and a data burst length (e.g., BL/2). The block 540 may add the compressed sum of the ODT latencies and CRC and the burst length of the access operation. The method 500 may include determining the burst length for each access operation using divided clocks on separate paths (e.g., even divided clock path and odd divided clock path). For example, the steps of block 540 may be implemented by and the BL decoders 234 and 235 and BL 228 and 229 of FIG. 2, which may be included in the third circuit area 430 of FIG. 4.

In some embodiments, the method 500 may include extending an RTT pulse based on the third combined value. For example, the block 540 may be implemented by pulse extenders 232 and 233 which use divided clocks on separate paths.

Block 540 is followed by block 550, which describes activating an ODT pulse signal (e.g., RTT Pulse) for a period of time based, at least in part, on the third combined value. For example, an RTT pulse shifter circuit (e.g., 237 of FIG. 2) may generate the ODT pulse signal with timing based on the third combined value. In some embodiments, the third combined value may be further adjusted to generate the final ODT pulse width.

For example, in some embodiments, the method may include calculating an RTT pulse width parity. For example, the block 560 may determine if the parity of RTT pulse width is 0 or 1 based on the ODT off latency the ODT on latency, and the CRC bit. The method 500 may include extending the RTT pulse based on the RTT pulse width parity to achieve the correct width. For example, using RTT pulse shifter 237 of FIG. 2. The method 500 may include increasing the compressed RTT pulse width (the third combined value) by a system clock to generate the RTT pulse width if the RTT pulse width parity is active.

The method 500 may be performed responsive to receiving a command signal (e.g., R/W of FIG. 1 and/or CMD of FIG. 2). The command may be received from a controller of the memory device and may specify an access operation, such as read, write, or RdNT, WrNT. In some embodiments, the method 500 may be repeated for different types of command, and different types of command may specify different values for the ODT off latency, the ODT on latency, the burst length, the cyclic redundancy check bit, and the value that the termination resistance is changed to. For example, there may be a first value of the ODT on latency for a first type of command, a second value of the ODT on latency for a second type of command, and so forth.

The method 500 may include changing a resistance of a data terminal when the ODT pulse signal is active. For example, the method 500 may include changing the resistance from a resting or park value to a value associated with a specified operation for the length of time that the ODT pulse signal is active.

In some embodiments, the values of the ODT on and off latencies, the CRC bit value, and the burst length may be fixed between commands of a same type. For example those settings may be stored in registers of a mode register such as 130 of FIG. 1. In some embodiments, the values of the burst length may be specified by the operation by the command address. The method 500 may include reading the ODT on and off latencies, the CRC bit, and burst length from a mode register and receiving the burst length on-the-fly from a command address.

The method 500 may include receiving the command in synchronization with an even divided clock signal or an odd divided clock signal. The method 500 may include activating the ODT pulse signal in sync with the even divided clock signal if the command was received in sync with the even divided clock signal and activating the ODT pulse signal in sync with the odd divided clock signal if the command was received in sync with the odd divided clock signal. The method 500 may include receiving a system clock (e.g., CK and/CK of FIG. 1) and splitting it into the even divided clock and the odd divided clock signals (e.g., LCLK of FIG. 1).

The method 500 may include partly determining the length (e.g., pulse width) of the ODT pulse signal with an even path circuit (e.g., 228/229 of FIGS. 2 and/or 432/434 of FIG. 4) if the command was received in sync with the even divided clock signal and determining the length of the ODT pulse signal with an odd path circuit if the command was received in sync with the odd divided clock signal. The method 500 may include performing the steps of blocks 510-530 with the same circuits regardless of whether the command was received in sync with an even or odd divided clock signal and performing the step of block 540 with the different circuits (e.g., the even or odd paths) depending on if the command was received in sync with the even or odd divided clock signal.

As used herein, an activation of a signal may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level. One of skill in the art should understand that although embodiments may be described with respect to a particular type of activation used by a particular circuit (e.g., active high), other embodiments may use other types of activation (e.g., active low).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a control circuit configured to set a width of an ODT pulse signal based, at least in part, on an on-die-termination (ODT) on timing value, an ODT off timing value, a burst-length (BL) related value and either a plus one or a zero value corresponding to activation or inactivation respectively of cyclic-redundancy-check (CRC);
wherein the control circuit includes:
a first circuit portion configured to logically combine the plus one or zero value or CRC and one of the ODT on timing value and the ODT off timing value to produce a first combined value;
a second circuit portion configured to compress the first combined value in such a way that combination of the compressed first combined value and the other of the ODT on timing information and the ODT off timing information always takes an even value;
a third circuit portion configured to logically combine the compressed first combined value and the other of the ODT on timing information and the ODT off timing information to produce a second combined value which is logically controlled not to take an odd value; and
a fourth circuit portion configured to logically combine the second combined value and the BL related value to produce a third combined value, wherein the width of the ODT pulse signal is based, at least in part, on the third combined value.

2. The apparatus of claim 1, wherein the control circuit is configured to set the width based on an even divided clock signal if a command is received in sync with the even divided clock signal and based on an odd divided clock signal if the command is received in sync with the odd divided clock signal,
wherein each of the first, second, and third circuit portions are provided commonly for the even and odd divided clock signals, and
wherein the fourth circuit portion includes two circuits corresponding to even and odd divided clock signals, respectively.

3. The apparatus of claim 1, further comprising a burst length decoder configured to generate a pulse width parity, wherein the third combined value is combined with the pulse width parity to determine the width of the ODT pulse signal.

4. The apparatus of claim 1, further comprising a termination circuit configured to change a resistance coupled to a data terminal while the ODT pulse signal is active.

5. The apparatus of claim 1, wherein the second circuit portion is configured to round the first combined value to a next lowest even value if the other of the ODT on timing value and the ODT off timing value has an even value and round the first combined value to a next lowest odd value if the other of the ODT on timing value and the ODT off timing value has an odd value.

6. The apparatus of claim 1, wherein the first circuit portion, the second circuit portion, the third circuit portion, and the fourth together have a total number of less than a hundred logic gates.

7. The apparatus of claim 1, further comprising a mode register configured to store the ODT on timing value, the ODT off timing value, the CRC bit value, and the burst length setting.

8. An apparatus comprising:

a mode register configured to store an on-die termination (ODT) on latency and an ODT off latency;

an ODT control circuit configured to compress the combined value of the ODT off latency and a cyclic redundancy check (CRC) bit based on the value of the ODT on latency and combine the compressed combined value of the ODT off latency and the CRC bit with the ODT on latency to generate an ODT offset value, wherein the ODT control circuit is further configured to receive a command signal and activate an ODT pulse signal in synchronization with an even divided clock or an odd divided clock based on when the command signal was received, and wherein the ODT pulse signal is active for a duration based, in part, on the ODT offset value; and a termination circuit configured to change a value of a termination resistor while the ODT pulse signal is active.

9. The apparatus of claim 8, wherein the ODT control circuit is configured to compress the combined value of the ODT off latency and the CRC bit and generate the ODT offset value before combining the burst length, which may be adjusted for each command, in synchronization with the even or the odd divided clock.

10. The apparatus of claim 8, wherein the ODT control circuit is further configured to combine the CRC bit with the ODT off latency before compressing the combined value of the ODT off latency and CRC value, and wherein the ODT offset value is a combined value of the ODT on latency and compressed combined ODT off latency and CRC value.

11. The apparatus of claim 8, wherein the ODT control circuit includes an even path configured to activate the ODT pulse signal in synchronization with the even divided clock and an odd path configured to activate the ODT pulse signal in synchronization with the odd divided clock.

12. The apparatus of claim 11, wherein the even and the odd paths are configured to add a burst length to the ODT offset value to generate the pulse width of the ODT pulse signal.

13. The apparatus of claim 11, wherein the ODT control circuit includes a compression circuit configured to compress the combined value of the ODT off latency and the CRC bit and an offset combination circuit configured to combine the compressed combined value of the ODT off latency and the CRC bit with the ODT on latency to generate the ODT offset value, wherein the compress circuit and the offset combination circuit are shared by both the even and odd paths.

14. The apparatus of claim 8, wherein the ODT control circuit is configured to compress the combined value of the ODT off latency and the CRC by rounding it to a next lowest even value if the ODT on latency has an even value and by rounding it to a next lowest odd value if the ODT on latency has an odd value.

15. A method comprising:

combining a cyclic redundancy check (CRC) bit with one of an ODT off latency and an ODT on latency to generate a first combined value;

compressing the first combined value based off of the other of the ODT off latency and the ODT on latency;

combining the compressed first combined value with the other of the ODT off latency and the ODT on latency to generate a second combined value;

combining the second combined value with a burst length along an even path or an odd path to generate a third combined value; and activating an ODT pulse signal for a period of time based, at least in part, on the third combined value.

16. The method of claim 15, further comprising compressing the first combined value by rounding to a next lowest even value if the other of the ODT off latency and the ODT on latency is even or rounding to a next lowest odd value if the other of the ODT off latency and the ODT on latency is odd.

17. The method of claim 15, further comprising generating the third combined value and activating the ODT pulse signal responsive to receiving a command.

18. The method of claim 15, further comprising:

activating the ODT pulse signal with the even path if the command is received in synchronization with an even divided clock signal; and activating the ODT pulse signal with the odd path if the command is received in synchronization with an odd divided clock signal.

19. The method of claim 18, further comprising generating the first combined value, compressing the first combined value and generating the second combined value with the same circuits regardless of whether the command is received in synchronization with the even divided clock signal or the odd divided clock signal.

20. The method of claim 15, further comprising changing a resistance of a data terminal while the ODT pulse signal is active.

* * * * *